United States Patent
Huang et al.

(10) Patent No.: US 10,178,802 B2
(45) Date of Patent: Jan. 8, 2019

(54) LIQUID SUPPLY DEVICE AND LIQUID COOLING SYSTEM

(71) Applicant: COOLER MASTER CO., LTD., New Taipei (TW)

(72) Inventors: Shih-Wei Huang, New Taipei (TW); Chu-Yi Kuo, New Taipei (TW); Chung-Yang Chen, New Taipei (TW)

(73) Assignee: Cooler Master Co., Ltd., New Taipei (TW)

(*) Notice: Subject to any disclaimer, the term of this patent is extended or adjusted under 35 U.S.C. 154(b) by 0 days.

(21) Appl. No.: 15/268,650

(22) Filed: Sep. 19, 2016

(65) Prior Publication Data
US 2018/0049345 A1   Feb. 15, 2018

(30) Foreign Application Priority Data
Aug. 10, 2016  (CN) .................... 2016 2 0862465 U

(51) Int. Cl.
*H05K 7/00* (2006.01)
*H05K 7/20* (2006.01)
*G01F 23/38* (2006.01)

(52) U.S. Cl.
CPC ......... *H05K 7/20272* (2013.01); *G01F 23/38* (2013.01); *Y10S 165/005* (2013.01)

(58) Field of Classification Search
CPC ..... F28F 27/00; F28F 2025/005; F16N 11/00; F16N 11/04; F25B 45/00; Y10S 165/005
USPC ............ 165/11.1, DIG. 5; 184/36, 45.1, 45.2
See application file for complete search history.

(56) References Cited

U.S. PATENT DOCUMENTS

| | | | | |
|---|---|---|---|---|
| 3,602,794 A | * | 8/1971 | Westhaver | H02J 7/008 320/139 |
| 3,651,863 A | * | 3/1972 | Hughes | B64D 13/00 165/11.1 |
| 3,677,334 A | * | 7/1972 | Bathla | F28F 27/00 137/552 |
| 5,194,747 A | * | 3/1993 | Culpepper | G01F 23/292 250/577 |
| 2009/0277657 A1 | * | 11/2009 | Berger | B25D 17/24 173/114 |
| 2016/0338224 A1 | * | 11/2016 | Chen | F04B 11/0008 |
| 2016/0366786 A1 | * | 12/2016 | Liao | H05K 7/20272 |
| 2016/0366787 A1 | * | 12/2016 | Liao | H05K 7/20272 |
| 2016/0366788 A1 | * | 12/2016 | Liao | H05K 7/20272 |
| 2017/0034950 A1 | * | 2/2017 | Sung | G06F 1/20 |

* cited by examiner

*Primary Examiner* — Len Tran
*Assistant Examiner* — Eric Ruppert
(74) *Attorney, Agent, or Firm* — Alan D. Kamrath; Kamrath IP Lawfirm, P.A.

(57) ABSTRACT

A liquid supply device includes a casing, a cover, a plunger, a driving unit and a sensing unit. The casing has a liquid outlet. The cover is connected to the casing. A chamber is formed between the casing and the cover. The chamber communicates with the liquid outlet. The plunger is movably disposed in the chamber. The driving unit is disposed in the chamber and used for driving the plunger to move. The sensing unit is selectively disposed on one of the cover and the plunger. The sensing unit outputs a sensing signal according to a current position of the plunger.

13 Claims, 5 Drawing Sheets

LIQUID SUPPLY DEVICE AND LIQUID COOLING SYSTEM

BACKGROUND OF THE INVENTION

1. Field of the Invention

The invention relates to a liquid supply device and a liquid cooling system and, more particularly, to a liquid supply device with a liquid level detecting function and a liquid cooling system equipped with the liquid supply device.

2. Description of the Prior Art

In general, a liquid cooling system essentially consists of a liquid cooling head, a radiator, a pump and a liquid storage box connected through a plurality of tubes. When the liquid cooling system is dissipating heat from an electronic component, the pump transports a cooling liquid to the liquid cooling head, the cooling liquid absorbs the heat generated by the electronic component, and then the radiator cools the cooling liquid. After the liquid cooling system is used for a long time, the cooling liquid will reduce due to vaporization, such that the cooling liquid may be insufficient. If the user does not supply the cooling liquid in time, the liquid cooling system may be damaged due to insufficient cooling liquid.

SUMMARY OF THE INVENTION

The invention provides a liquid supply device with a liquid level detecting function and a liquid cooling system equipped with the liquid supply device, so as to solve the aforesaid problems.

According to an embodiment of the invention, a liquid supply device comprises a casing, a cover, a plunger, a driving unit and a sensing unit. The casing has a liquid outlet. The cover is connected to the casing. A chamber is formed between the casing and the cover. The chamber communicates with the liquid outlet. The plunger is movably disposed in the chamber. The driving unit is disposed in the chamber and used for driving the plunger to move. The sensing unit is selectively disposed on one of the cover and the plunger. The sensing unit outputs a sensing signal according to a current position of the plunger.

According to another embodiment of the invention, a liquid supply device comprises a casing, a cover, a plunger, a driving unit, a magnetic strip and a sensing unit. The casing has a liquid outlet. The cover is connected to the casing. A chamber is formed between the casing and the cover. The chamber communicates with the liquid outlet. The plunger is movably disposed in the chamber. The driving unit is disposed in the chamber and used for driving the plunger to move. The magnetic strip is disposed on the casing along an axial direction of the casing. The sensing unit is disposed on the plunger. The sensing unit senses a magnetic field strength of the magnetic strip and outputs a sensing signal corresponding to the magnetic field strength.

According to another embodiment of the invention, a liquid supply device comprises a casing, a cover, a plunger, a driving unit and a sensing unit. The casing has a liquid outlet. The cover is connected to the casing. A chamber is formed between the casing and the cover. The chamber communicates with the liquid outlet. The plunger is movably disposed in the chamber. The driving unit is disposed in the chamber and used for driving the plunger to move. The sensing unit is disposed on the cover. The sensing unit senses a current distance between the plunger and the sensing unit and outputs a sensing signal corresponding to the current distance.

According to another embodiment of the invention, a liquid cooling system comprises a liquid supply device, an alarm unit and a processing unit. The liquid supply device comprises a casing, a cover, a plunger, a driving unit and a sensing unit. The casing has a liquid outlet. The cover is connected to the casing. A chamber is formed between the casing and the cover. The chamber communicates with the liquid outlet. The plunger is movably disposed in the chamber. The driving unit is disposed in the chamber and used for driving the plunger to move. The sensing unit is selectively disposed on one of the cover and the plunger. The sensing unit outputs a sensing signal according to a current position of the plunger. The processing unit is electrically connected to the sensing unit and the alarm unit. The processing unit converts the sensing signal into a liquid level and calculates a decreasing rate of the liquid level. The processing unit controls the alarm unit to send out an alarm message when the processing unit determines that the decreasing rate is larger than an evaporation rate.

According to another embodiment of the invention, a liquid cooling system comprises a liquid supply device, an alarm unit, a memory unit and a processing unit. The liquid supply device comprises a casing, a cover, a plunger, a driving unit and a sensing unit. The casing has a liquid outlet. The cover is connected to the casing. A chamber is formed between the casing and the cover. The chamber communicates with the liquid outlet. The plunger is movably disposed in the chamber. The driving unit is disposed in the chamber and used for driving the plunger to move. The sensing unit is selectively disposed on one of the cover and the plunger. The sensing unit outputs a sensing signal according to a current position of the plunger. The processing unit is electrically connected to the sensing unit, the alarm unit and the memory unit. The processing unit converts the sensing signal into a liquid level. The processing unit records the liquid level in the memory unit when the liquid cooling system is shut down. The processing unit determines whether a decreasing amount of the liquid level is larger than a predetermined threshold when the liquid cooling system is rebooted. The processing unit controls the alarm unit to send out an alarm message when the processing unit determines that the decreasing amount of the liquid level is larger than the predetermined threshold.

As mentioned in the above, the liquid supply device of the invention may be selectively connected to a specific component of the liquid cooling system (e.g. liquid cooling head, radiator, pump, liquid storage box, tubes, etc.). When the cooling liquid reduces and then the hydraulic pressure of the liquid cooling system reduces, the liquid supply device utilizes the driving unit to drive the plunger to move, so as to inject the cooling liquid from the chamber into the liquid cooling system. In other words, the liquid supply device of the invention can supply the cooling liquid to the liquid cooling system automatically when the cooling liquid is insufficient, so as to prevent the liquid cooling system from being damaged due to insufficient cooling liquid. Furthermore, the sensing unit can output the sensing signal according to the current position of the plunger and the processing unit can convert the sensing signal into the liquid level, such that the user can know well the remaining amount of the cooling liquid of the liquid supply device anytime. Moreover, when the liquid cooling system is working or rebooted, the invention can utilize the decreasing rate and/or the decreasing amount of the liquid level to determine whether the cooling liquid leaks abnormally. When determining that the cooling liquid leaks abnormally, the invention may further send out the alarm message (e.g. light, image, sound, vibration or a combination thereof) to inform the user.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
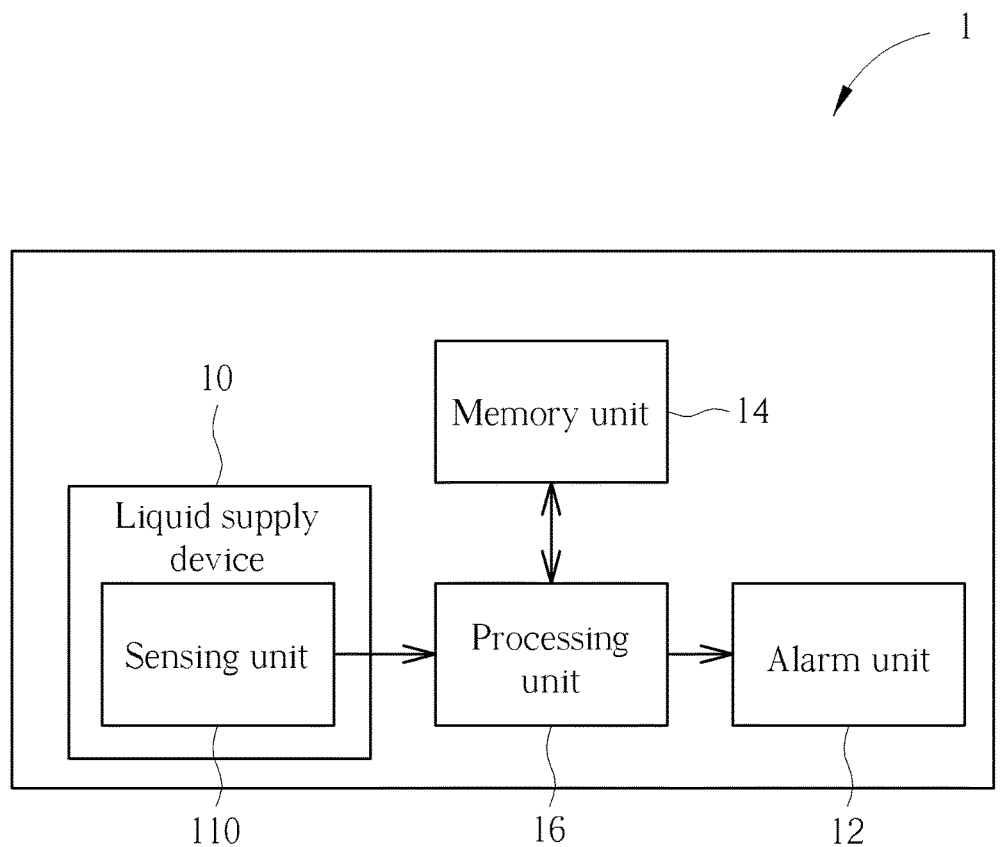
FIG. 1 is a functional block diagram illustrating a liquid cooling system according to an embodiment of the invention.
Figure 2:
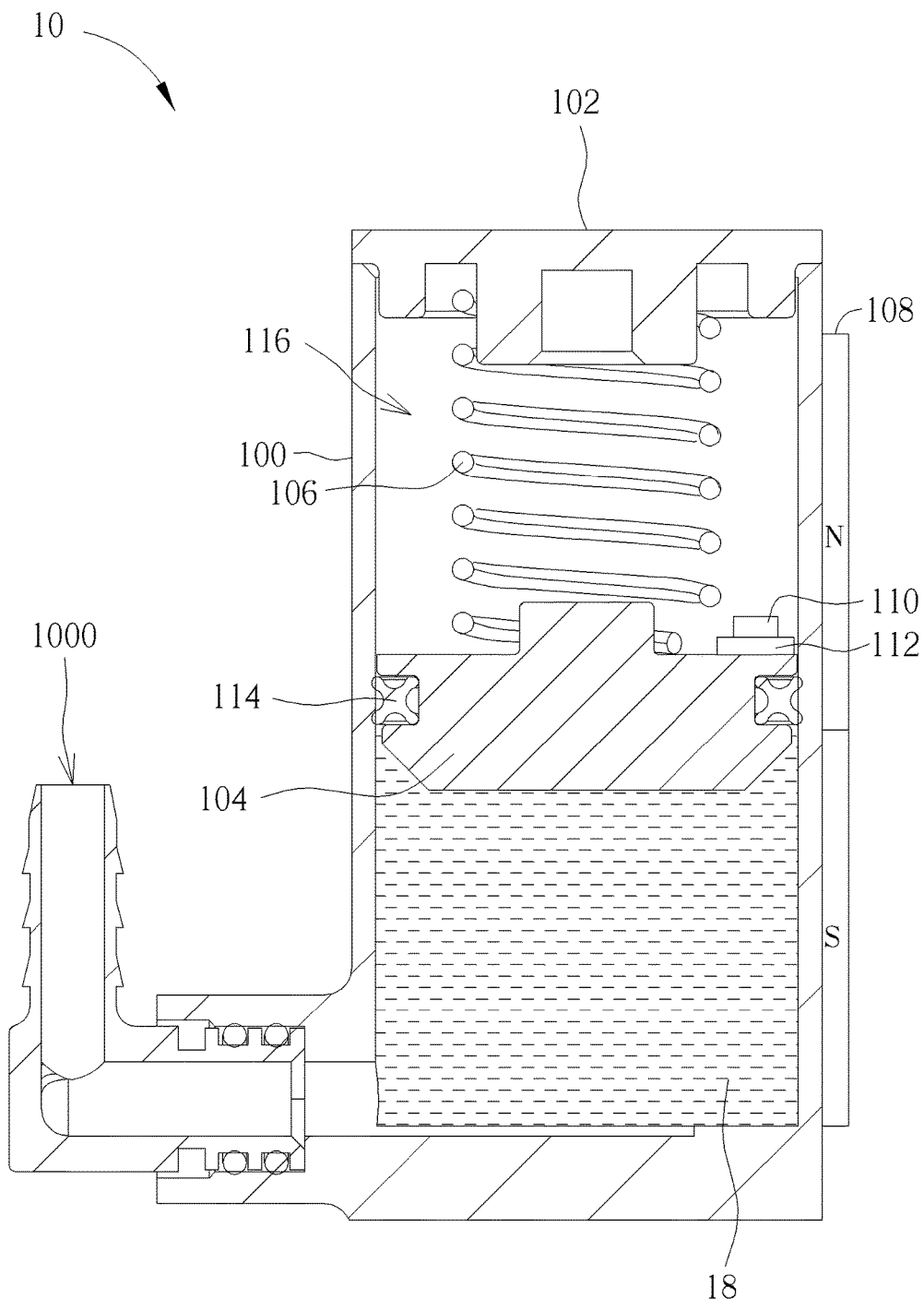
FIG. 2 is a schematic diagram illustrating a cross-section of the liquid supply device shown in FIG. 1.
Figure 3:
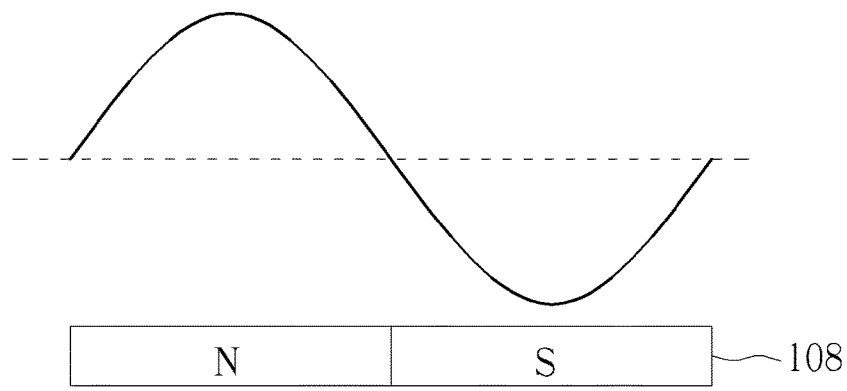
FIG. 3 is a curve diagram illustrating a variation of the magnetic field strength of the magnetic strip shown in FIG. 2.
Figure 4:
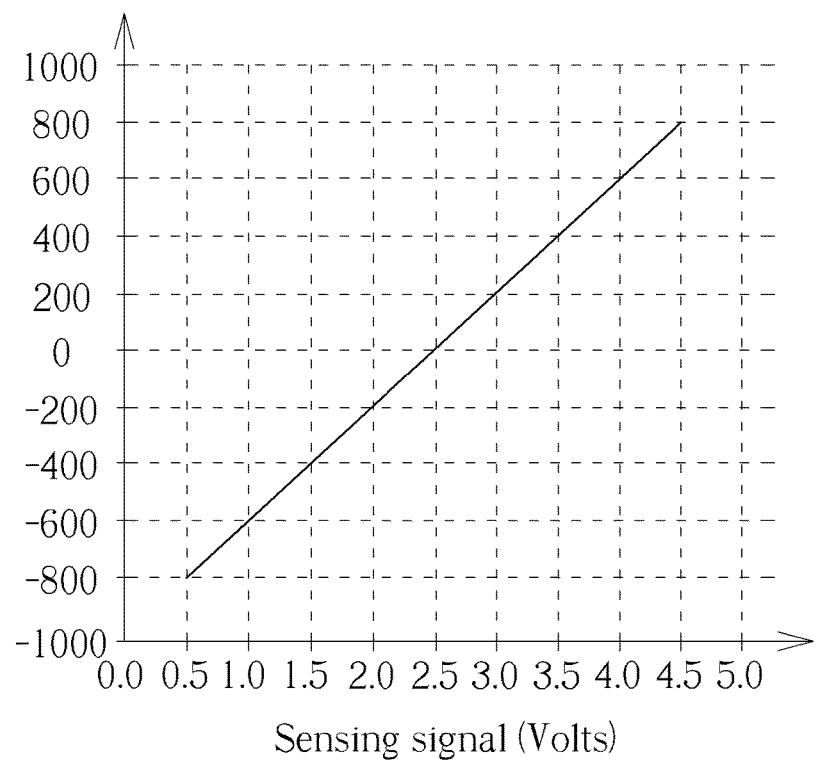
FIG. 4 is a diagram illustrating a relation between the magnetic field strength of the magnetic strip shown in FIG. 2 and the sensing signal.

Referring to FIGS. 1 to 4, FIG. 1 is a functional block diagram illustrating a liquid cooling system 1 according to an embodiment of the invention, FIG. 2 is a schematic diagram illustrating a cross-section of the liquid supply device 10 shown in FIG. 1, FIG. 3 is a curve diagram illustrating a variation of the magnetic field strength of the magnetic strip 108 shown in FIG. 2, and FIG. 4 is a diagram illustrating a relation between the magnetic field strength of the magnetic strip 108 shown in FIG. 2 and the sensing signal.

As shown in FIG. 1, a liquid cooling system 1 of the invention comprises a liquid supply device 10, an alarm unit 12, a memory unit and a processing unit 16, wherein the processing unit is electrically connected to a sensing unit 110 of the liquid supply device 10, the alarm unit 12 and the memory unit 14. In practical applications, the alarm unit 12 may be a light source, a display, a speaker, a vibrating motor or a combination thereof; the memory unit 14 may be a memory or other data storage devices; and the processing unit 16 may be a processor or a controller with data processing function. In general, the liquid cooling system 1 may be equipped with a liquid cooling head, a radiator, a pump, a liquid storage box and a plurality of tubes for connecting the aforesaid components. It should be noted that the pump may be integrated into the liquid cooling head and the liquid cooling system may be equipped with or not equipped with the liquid storage box according to practical applications. When the liquid cooling system is used for dissipating heat from an electronic component, the liquid cooling head of the liquid cooling system is attached on the electronic component. The cooling liquid of the liquid cooling head absorbs the heat generated by the electronic component and then the radiator cools the cooling liquid. Furthermore, the liquid cooling system 1 may be further equipped with some necessary hardware or software components for specific purposes, such as a circuit board, a power supply, an application, a communication module, etc., and it depends on practical applications.

As shown in FIG. 2, the liquid supply device 10 of the invention comprises a casing 100, a cover 102, a plunger 104, a driving unit 106, a magnetic strip 108, a sensing unit 110, a circuit board 112 and a washer 114. The casing 100 has a liquid outlet 1000. The cover 102 is connected to the casing 100 and a chamber 116 is formed between the casing 100 and the cover 102. The chamber 116 communicates with the liquid outlet 1000 and contains a cooling liquid 18. In practical applications, the cooling liquid 18 may be water or other cooling liquids. The plunger 104 is movably disposed in the chamber 116. The washer 114 is sleeved on an outer wall of the plunger 104 and abuts against an inner wall of the casing 100. Accordingly, the washer 114 can prevent the cooling liquid 18 from entering a space between the cover 102 and the plunger 104.

In this embodiment, the liquid supply device 10 of the invention may be selectively connected to a specific component of the liquid cooling system 1 (e.g. liquid cooling head, radiator, pump, liquid storage box, tubes, etc.). Accordingly, the liquid outlet 1000 may communicate with the specific component of the liquid cooling system 1, such that the cooling liquid 18 of the chamber 116 can be injected into the specific component of the liquid cooling system 1 through the liquid outlet 1000.

The driving unit 106 is disposed in the chamber 116 and the driving unit 106 is used for driving the plunger 104 to move. In this embodiment, the driving unit 106 may be a resilient member (e.g. spring or other resilient objects) and opposite ends of the driving unit 106 abut against the cover 102 and the plunger 104, respectively. Furthermore, the magnetic strip 108 is disposed on the casing 100 along an axial direction of the casing 100 and the sensing unit 110 is disposed on the plunger 104. In this embodiment, the sensing unit 110 may be disposed on the circuit board 112 and the circuit board 112 may be disposed on the plunger 104, such that the sensing unit 110 is disposed on the plunger 104. The sensing unit 110 is used for sensing a magnetic field strength of the magnetic strip 108. In this embodiment, the sensing unit 110 may be a Hall sensor.

As shown in FIG. 2, when the chamber 116 of the liquid supply device 10 contains the cooling liquid 18, the driving unit 106 is compressed. At this time, the driving unit 106 pushes the plunger 104 to move downward in the chamber 116 till the hydraulic pressure of the liquid cooling system 1 balances. When the cooling liquid of the liquid cooling system 1 reduces and then the hydraulic pressure reduces, the driving unit 106 of the liquid supply device 10 will push the plunger 104 to move, so as to inject the cooling liquid 18 from the chamber 116 into the specific component of the liquid cooling system 1 (e.g. liquid cooling head, radiator, pump, liquid storage box, tubes, etc.). In other words, the liquid supply device 10 of the invention can supply the cooling liquid to the liquid cooling system 1 automatically when the cooling liquid is insufficient, so as to prevent the liquid cooling system 1 from being damaged due to insufficient cooling liquid. It should be noted that in addition to using the driving unit 106 to generate elastic force to push the plunger 104 to move, the invention may also replace the driving unit 106 by other mechanisms, which may generate normal force, shearing force, torque or magnetic force, to push the plunger 104 to move, so as to supply the cooling liquid.

When the plunger 104 is located at a specific position in the chamber 116, the sensing unit 110 will sense a magnetic field strength of the magnetic strip 108 and then output a sensing signal corresponding to the magnetic field strength. In other words, since the sensing unit 110 is disposed on the plunger 104, the sensing unit 110 can sense the magnetic field strength of the magnetic strip 108 and output the sensing signal corresponding to the magnetic field strength according to a current position of the plunger 104. As shown in FIG. 3, the invention may magnetize the magnetic field strength of the magnetic strip 108 to be a sinusoidal wave, such that the magnetic field strength of the magnetic strip 108 has a sinusoidal variation. When the sensing unit 110 senses different magnetic field strengths corresponding to different positions of the magnetic strip 108, the sensing unit 110 outputs different voltage levels to be the sensing signal correspondingly, as shown in FIG. 4. Then, the processing unit 16 converts the sensing signal outputted by the sensing unit 110 into a liquid level of the cooling liquid 18 in the chamber 116. In practical applications, the processing unit 16 may output the liquid level of the cooling liquid 18 in the chamber 116 to a display. Accordingly, the user can know well the remaining amount of the cooling liquid 18 of the liquid supply device 10 anytime. It should be noted that the invention may record the voltage level of the sensing signal and the corresponding liquid level by a look-up table and then store the look-up table in the memory unit 104. Accordingly, the processing unit 16 may look the sensing signal outputted by the sensing unit 110 up in the look-up table, so as to obtain the liquid level of the cooling liquid 18 in the chamber 116 correspondingly.

In the embodiment shown in FIG. 1, the processing unit 16 is disposed outside the liquid supply device 10. However, in another embodiment, the processing unit 16 may be disposed inside the liquid supply device 10 according to practical applications. In other words, the invention may utilize the processing unit 16 disposed outside or inside the liquid supply device 10 to convert the sensing signal outputted by the sensing unit 110 into the liquid level of the cooling liquid 18 in the chamber 116. Furthermore, the signal transmitting line (not shown) of the circuit board 112 may be pulled out from the cover 102, so as to be connected to related component.

Still further, the processing unit 16 may further calculate a decreasing rate of the liquid level. For example, when the liquid level decreases from H1 to H2 during time period T, the decreasing rate of the liquid level may be calculated as (H1−H2)/T. Moreover, the invention may record different evaporation rates of the cooling liquid 18 under different temperatures by a look-up table and then store the look-up table in the memory unit 104. The processing unit 16 may obtain a current temperature by a temperature sensor (not shown) and then look the current temperature up in the look-up table, so as to obtain the evaporation rate corresponding to the current temperature. When the decreasing rate of the liquid level of the cooling liquid 18 is larger than the evaporation rate under the current temperature, it means that the cooling liquid 18 in the liquid supply device 10 may leak abnormally. Accordingly, when the processing unit 16 determines that the decreasing rate is larger than the evaporation rate under the current temperature, the processing unit 16 may control the alarm unit 12 to send out an alarm message to inform the user. In this embodiment, the alarm message may be light, image, sound, vibration or a combination thereof according to practical applications.

In addition, when the liquid cooling system 1 is shut down, the processing unit 16 may record the current liquid level in the memory unit 14. When the liquid cooling system 1 is rebooted, the processing unit 16 may determine whether a decreasing amount of the liquid level is larger than a predetermined threshold first. If the decreasing amount of the liquid level is larger than the predetermined threshold, it means that the cooling liquid 18 decreases abnormally (decreases too much) during shut down, i.e. the cooling liquid 18 leaks abnormally. Accordingly, when the processing unit 16 determines that the decreasing amount of the liquid level is larger than the predetermined threshold, the processing unit 16 may control the alarm unit 12 to send out the alarm message to inform the user. The aforesaid predetermined threshold may be set according to practical applications.

Figure 5:
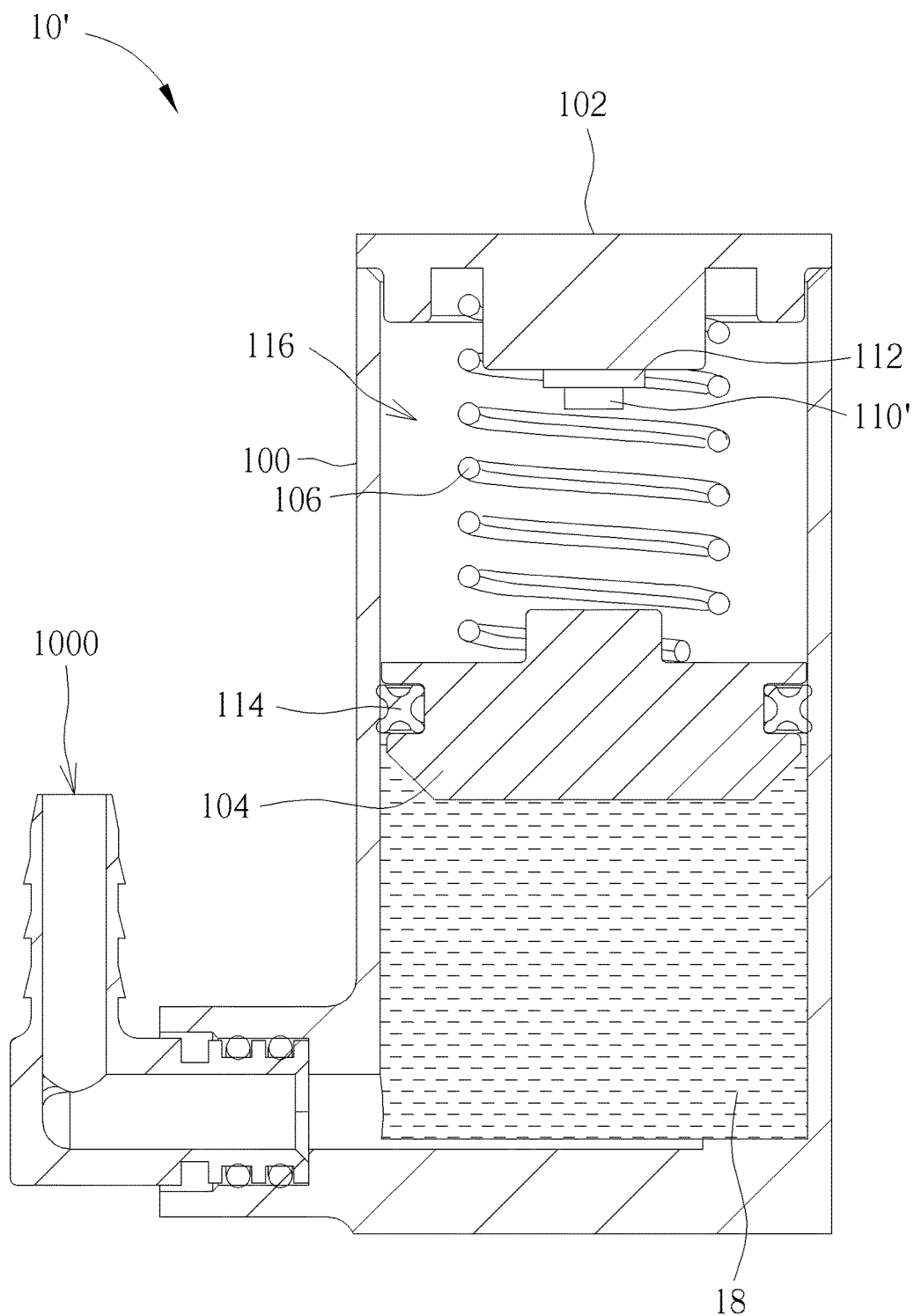
FIG. 5 is a schematic diagram illustrating a cross-section of a liquid supply device according to another embodiment of the invention.

Referring to FIG. 5, FIG. 5 is a schematic diagram illustrating a cross-section of a liquid supply device 10' according to another embodiment of the invention. The main difference between the liquid supply device 10' and the aforesaid liquid supply device 10 is that the sensing unit 110' of the liquid supply device 10' is disposed on the cover 102 and the liquid supply device 10' is not equipped with the aforesaid magnetic strip 108, as shown in FIG. 5. In this embodiment, the sensing unit 110' is disposed on the circuit board 112 and the circuit board 112 is disposed on the cover 102, such that the sensing unit 110' is disposed on the cover 102. In this embodiment, the sensing unit 110' may be a proximity sensor or a proximity/ambient light sensor according to practical applications. Accordingly, when the plunger 104 is located at a specific position in the chamber 116, the sensing unit 110' will sense a current distance between the plunger 104 and the sensing unit 110' and output a sensing signal corresponding to the current distance. After receiving the sensing signal outputted by the sensing unit 110', the processing unit 16 converts the sensing signal into a liquid level of the cooling liquid 18 in the chamber 116. For example, provided that a distance between the cover 102 and a bottom of the casing 100 is D1, the current distance between the plunger 104 and the sensing unit 110' is D2, and a thickness of the plunger 104 corresponding to the sensing unit 110' is t, so the liquid level of the cooling liquid 18 in the chamber 116 may be calculated by D1−D2−t. It should be noted that the same elements in FIG. 5 and FIG. 2 are represented by the same numerals, so the repeated explanation will not be depicted herein again. Furthermore, the liquid supply device 10' may also be applied to the aforesaid liquid cooling system 1 to perform the aforesaid alarm function.

Figure 6:
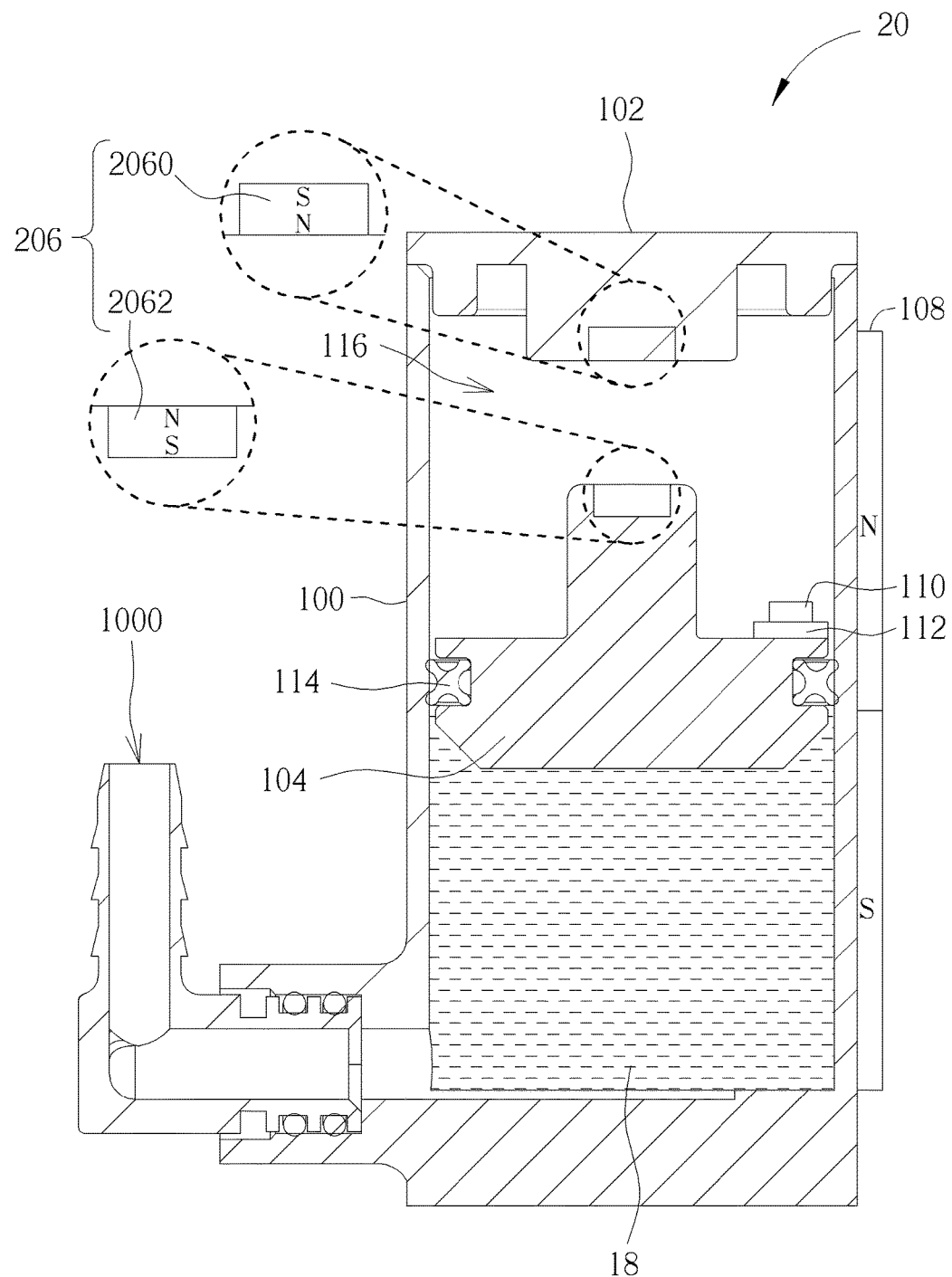
FIG. 6 is a schematic diagram illustrating a cross-section of a liquid supply device according to another embodiment of the invention.

Referring to FIG. 6, FIG. 6 is a schematic diagram illustrating a cross-section of a liquid supply device 20 according to another embodiment of the invention. The main difference between the liquid supply device 20 and the aforesaid liquid supply device 10 is that the liquid supply device 20 replaces the aforesaid driving unit 106 by a driving unit 206. As shown in FIG. 6, the driving unit 206 comprises a first magnetic area 2060 and a second magnetic area 2062. The first magnetic area 2060 is disposed on the cover 102 and the second magnetic area 2062 is disposed on the plunger 104, wherein a position of the first magnetic area 2060 is corresponding to a position of the second magnetic area 2062. A magnetic pole of an end of the first magnetic area 2060 facing the second magnetic area 2062 is identical to a magnetic pole of an end of the second magnetic area 2062 facing the first magnetic area 2060, such that a magnetic repulsive force is generated between the first magnetic area 2060 and the second magnetic area 2062. It should be noted that the magnetic pole of an end of the first magnetic area 2060 facing the second magnetic area 2062 and the magnetic pole of an end of the second magnetic area 2062 facing the first magnetic area 2060 both may be north magnetic poles or south magnetic poles according to practical applications. In this embodiment, the first magnetic area 2060 may be a magnet or an electromagnet, and the second magnetic area 2062 may be a magnet. It should be noted that the same elements in FIG. 6 and FIG. 2 are represented by the same numerals, so the repeated explanation will not be depicted herein again.

When the chamber 116 of the liquid supply device 20 contains the cooling liquid 18, the magnetic repulsive force generated between the first magnetic area 2060 and the second magnetic area 2062 balances with the hydraulic pressure generated by the cooling liquid 18. Meanwhile, the plunger 104 stays static in the chamber 116. When the cooling liquid of the liquid cooling system reduces and then the hydraulic pressure reduces, the magnetic repulsive force generated between the first magnetic area 2060 and the second magnetic area 2062 will push the plunger 104 to move, so as to inject the cooling liquid 18 from the chamber 116 into a specific component of the liquid cooling system (e.g. liquid cooling head, radiator, pump, liquid storage box, tubes, etc.). On the other hand, when the magnetic repulsive force generated between the first magnetic area 2060 and the second magnetic area 2062 balances with the hydraulic pressure generated by the cooling liquid 18 again, the plunger 104 stops moving.

As mentioned in the above, the liquid supply device of the invention may be selectively connected to a specific component of the liquid cooling system (e.g. liquid cooling head, radiator, pump, liquid storage box, tubes, etc.). When the cooling liquid reduces and then the hydraulic pressure of the liquid cooling system reduces, the liquid supply device utilizes the driving unit to drive the plunger to move, so as to inject the cooling liquid from the chamber into the liquid cooling system. In other words, the liquid supply device of the invention can supply the cooling liquid to the liquid cooling system automatically when the cooling liquid is insufficient, so as to prevent the liquid cooling system from being damaged due to insufficient cooling liquid. Furthermore, the sensing unit can output the sensing signal according to the current position of the plunger and the processing unit can convert the sensing signal into the liquid level, such that the user can know well the remaining amount of the cooling liquid of the liquid supply device anytime. Moreover, when the liquid cooling system is working or rebooted, the invention can utilize the decreasing rate and/or the decreasing amount of the liquid level to determine whether the cooling liquid leaks abnormally. When determining that the cooling liquid leaks abnormally, the invention may further send out the alarm message (e.g. light, image, sound, vibration or a combination thereof) to inform the user.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A liquid cooling system comprising:
   a liquid supply device comprising:
      a casing having a liquid outlet;
      a cover connected to the casing, a chamber being formed between the casing and the cover, the chamber communicating with the liquid outlet;
      a plunger movably disposed in the chamber;
      a driving unit disposed in the chamber, the driving unit driving the plunger to move; and
      a sensing unit selectively disposed on one of the cover and the plunger, the sensing unit outputting a sensing signal according to a current position of the plunger;
   an alarm unit; and
   a processing unit electrically connected to the sensing unit and the alarm unit, the processing unit converting the sensing signal into a liquid level and calculating a decreasing rate of the liquid level, the processing unit controlling the alarm unit to send out an alarm message when the processing unit determines that the decreasing rate is larger than an evaporation rate.

2. The liquid cooling system of claim 1, further comprising a memory unit electrically connected to the processing unit, the processing unit recording the liquid level in the memory unit when the liquid cooling system is shut down, the processing unit determining whether a decreasing amount of the liquid level is larger than a predetermined threshold when the liquid cooling system is rebooted, the processing unit controlling the alarm unit to send out the alarm message when the processing unit determines that the decreasing amount of the liquid level is larger than the predetermined threshold.

3. The liquid cooling system of claim 1, wherein the liquid supply device further comprises a magnetic strip, the magnetic strip is disposed on the casing along an axial direction of the casing, the sensing unit is disposed on the plunger, and the sensing unit senses a magnetic field strength of the magnetic strip and outputs a sensing signal corresponding to the magnetic field strength.

4. The liquid cooling system of claim 3, wherein the sensing unit is a Hall sensor.

5. The liquid cooling system of claim 3, wherein magnetic field strength of the magnetic strip has a sinusoidal variation.

6. The liquid cooling system of claim 1, wherein the sensing unit is disposed on the cover, and the sensing unit senses a current distance between the plunger and the sensing unit and outputs a sensing signal corresponding to the current distance.

7. The liquid cooling system of claim 6, wherein the sensing unit is a proximity sensor.

8. A liquid cooling system comprising:
   a liquid supply device comprising:
      a casing having a liquid outlet;
      a cover connected to the casing, a chamber being formed between the casing and the cover, the chamber communicating with the liquid outlet;
      a plunger movably disposed in the chamber;
      a driving unit disposed in the chamber, the driving unit driving the plunger to move; and
      a sensing unit selectively disposed on one of the cover and the plunger, the sensing unit outputting a sensing signal according to a current position of the plunger;
   an alarm unit;
   a memory unit; and
   a processing unit electrically connected to the sensing unit, the alarm unit and the memory unit, the processing unit converting the sensing signal into a liquid level, the processing unit recording the liquid level in the memory unit when the liquid cooling system is shut down, the processing unit determining whether a decreasing amount of the liquid level is larger than a predetermined threshold when the liquid cooling system is rebooted, the processing unit controlling the alarm unit to send out an alarm message when the processing unit determines that the decreasing amount of the liquid level is larger than the predetermined threshold.

9. The liquid cooling system of claim 8, wherein the liquid supply device further comprises a magnetic strip, the magnetic strip is disposed on the casing along an axial direction of the casing, the sensing unit is disposed on the plunger, and the sensing unit senses a magnetic field strength of the magnetic strip and outputs a sensing signal corresponding to the magnetic field strength.

10. The liquid cooling system of claim 9, wherein the sensing unit is a Hall sensor.

11. The liquid cooling system of claim 9, wherein the magnetic field strength of the magnetic strip has a sinusoidal variation.

12. The liquid cooling system of claim 8, wherein the sensing unit is disposed on the cover, and the sensing unit senses a current distance between the plunger and the sensing unit and outputs a sensing signal corresponding to the current distance.

13. The liquid cooling system of claim 12, wherein the sensing unit is a proximity sensor.

\* \* \* \* \*